(12) United States Patent
Guo et al.

(10) Patent No.: US 7,635,974 B2
(45) Date of Patent: Dec. 22, 2009

(54) MAGNETIC TUNNEL JUNCTION (MTJ) BASED MAGNETIC FIELD ANGLE SENSOR

(75) Inventors: Yimin Guo, San Jose, CA (US); Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 428 days.

(21) Appl. No.: 11/799,706

(22) Filed: May 2, 2007

(65) Prior Publication Data

US 2008/0272771 A1 Nov. 6, 2008

(51) Int. Cl.
G01B 7/30 (2006.01)
(52) U.S. Cl. .............................. 324/207.21; 324/207.25; 324/252; 438/3; 438/48
(58) Field of Classification Search ........................ None
See application file for complete search history.

(56) References Cited

U.S. PATENT DOCUMENTS

| | | | |
|---|---|---|---|
| 5,764,567 A | 6/1998 | Parkin | |
| 6,011,390 A | 1/2000 | Loreit et al. | |
| 6,100,686 A | 8/2000 | Van Delden et al. | |
| 6,633,462 B2 | 10/2003 | Adelerhof | |
| 6,756,782 B2 | 6/2004 | Van Zon | |
| 6,771,472 B1 | 8/2004 | Mao et al. | |
| 6,891,368 B2 | 5/2005 | Kawano et al. | |
| 6,992,869 B2 | 1/2006 | Suzuki et al. | |
| 7,054,114 B2 | 5/2006 | Jander et al. | |

FOREIGN PATENT DOCUMENTS

| | | |
|---|---|---|
| WO | WO 96/29568 | 9/1996 |
| WO | WO 98/48291 | 10/1998 |
| WO | WO 03/069690 | 8/2003 |

OTHER PUBLICATIONS

"Applications of Magnetic Position Sensors", Honeywell Application Note—An211, Found Mar. 20, 2007, www.ssec.honeywell.com/magnetic/datasheets/an211.pdf.
"Angular Sensor Using Tunneling Magnetoresistive Junctions With an Artificial Antiferromagnet Reference Electrode and Improved Thermal Stability", IEEE Trans. on Magnetics, vol. 40, No. 1, Jan. 2004, by Manfred Ruhrig et al., pp. 101-104.
"360° Angle Sensor Using Spin Valve Materials With SAF Structure", by Dexin Wang et al., IEEE Trans. on Magnetics, vol. 41, No. 10, Oct. 2005, pp. 3700-3702.

*Primary Examiner*—Jay M Patidar
(74) *Attorney, Agent, or Firm*—Saile Ackerman LLC; Stephen B. Ackerman; Billy Knowles

(57) ABSTRACT

A magnetic field angle sensor for measurement of a magnetic field angle over a 360° range has magnetic tunnel junction elements oriented at multiple angles. The magnetic field angle sensor includes multiple magnetic tunnel junction elements formed on a substrate that have an anti-ferromagnetic layer and pinned synthetic multiple layer. The magnetic tunnel junction elements are patterned to have a large dimensional aspect ratio and large anisotropies the pinned synthetic multiple layer of the magnetic tunnel junction elements. The magnetic tunnel junction elements are annealed in the presence of a strong magnetic field in a direction of the reference axis and the annealed for a second time with no external magnetic field so that exchange pinning is reduced and strong stress induced anisotropies of the pinned synthetic multiple layer align magnetization of the pinned synthetic multiple layer align a long axis of each of the magnetic tunnel junction elements.

84 Claims, 9 Drawing Sheets

FIG. 1 - Prior Art

MAGNETIC TUNNEL JUNCTION (MTJ) BASED MAGNETIC FIELD ANGLE SENSOR

BACKGROUND OF THE INVENTION

1. Field of the Invention

This invention relates generally to magneto-resistive sensor devices for detecting a magnetic field impinging upon the magneto-resistive sensor device. More particularly, this invention relates to magnetic field angle sensors for measurement of a magnetic field angle over a 360° range of measurement.

2. Description of Related Art

Magnetic position sensing is becoming a popular method of implementing a non-contacting location of objects in motion. By affixing a magnet or sensor element to an angular or linear moving object with its complementary sensor or magnet stationary, the relative direction of the resulting magnetic field can be quantified electronically. By utilizing multiple sensors or magnets, the capability of extended angular or linear position measurements can be enhanced. "Applications of Magnetic Position Sensors", Honeywell Application Note-AN211, found www.ssec.honeywell.com/magnetic/datasheets/an211.pdf, Mar. 20, 2007 describes magnetic position sensing using Anisotropic Magneto-Resistive (AMR) sensors.

Further, AN211 describes the use of an anisotropic magneto-resistive material such as Permalloy to form four anisotropic magneto-resistive (AMR) elements 10a, 10b, 10c, and 10d that are connected as a Wheatstone bridge sensor 5, as shown in FIG. 1. Each magneto-resistive element 10a, 10b, 10c, and 10d possesses an ability to change resistance in a $\cos^2(\theta)$ relationship where $\theta$ (theta) is the angle between the magnetic moment (M) vector 25a, 25d, 25c, and 25d and the current flow (I) 20a, 20d, 20c, and 20d.

The sensor is formed from the AMR elements 10a, 10b, 10c, and 10d, the four elements 10a, 10b, 10c, and 10d are oriented in a diamond shape with the ends connected together by metallization 12a, 12b, 12c, and 12d to form the Wheatstone bridge. The top and bottom connections of the four identical elements are connected Direct Current (DC) power supply voltage source ($V_s$) 15. The remaining two opposing side connection terminals 12c and 12d are the sense point of the measurement. With no magnetic field supplied (0 gauss), the side connection terminals 12c and 12d have an equal voltage level with the exception of a small offset voltage due to manufacturing tolerances on the AMR elements 10a, 10b, 10c, and 10d. The Wheatstone bridge connection structure 5 produces a differential voltage ($\Delta V$) as a function of the supply voltage $V_s$, The ratio of the resistance of the AMR elements 10a, 10b, 10c, and 10d, and the angle ($\theta$) between the element current flow (I) 20a, 20d, 20c, and 20d and element magnetization (M) 25a, 25d, 25c, and 25d The Wheatstone bridge 5 as constructed provide an angle measurement of +/−45°. To provide measurement of from +/−45° to +/−90° requires two Wheatstone sensors with 45° displacement from each other, the two linear slopes can be used additively. A full 360° rotational position sensing solution uses two of the Wheatstone bridge sensors 5 combined with a hall effect sensor. Most hall effect sensors use silicon semiconducting materials to create a proportional voltage output as a magnetic field vector slices orthogonally through the slab material with a bias current flowing through it to generate a signed vector of the impinging magnetic field.

"Angular Sensor Using Tunneling Magneto-resistive Junctions with an Artificial Antiferromagnet Reference Electrode and Improved Thermal Stability", Ruhrig, et al., IEEE Transactions on Magnetics, January 2004 Volume: 40, Issue: 1, pp.: 101-104, describes fabrication of Magnetic tunneling junctions (MTJs) using CoFe—Ru—CoFe artificial antiferromagnet (AAF) sandwiches as a hard-magnetic reference layer and plasma-oxidized aluminum as a tunnel barrier. Tailoring the magnetic properties of the artificial antiferromagnet reference layer allows an on-chip magnetization (initialization) of individual junctions, which makes it possible to build monolithic Wheatstone without multiple mask process steps or on-chip heating elements. It should be noted that the MTJ elements of Ruhrig et al. require that each MTJ element be initialized individually with locally applied current pulses. This is not practical for mass production applications.

"360° Angle Sensor Using Spin Valve Materials with SAF Structure", Wang et al., IEEE Transactions on Magnetics, October 2005, Volume: 41, Issue: 10, pp.: 3700-3702, illustrates the design, fabrication and test of microchips of 360° angle sensors using spin valve materials. The angle sensor is used stationary in combination with a disc-shaped permanent magnet attached to a rotating shaft near the sensor. The permanent magnet is magnetized in-plane, thus creating a field that is rotating with the shaft. The magnetic field from the permanent magnet forces the free layer magnetization to follow the field and rotate with it. With a fixed reference layer magnetization and an in-phase following of the free layer magnetization, the magneto-resistance is a simple cosine function of the angle between the rotating permanent magnet and the stationary sensor. A special Wheatstone-bridge with four separate spin valve resistors is used to compensate the thermal drift expected in application environments. One half bridge has a 90° phase delay from the other, resulting in a cosine and a sine function, in combination to uniquely determine any angular relationship between the permanent magnet and the sensor between 0° to 360°. A draw back of the 360° Angle Sensor of Wang et al. is that it is not a single chip integrated solution, but a multiple component implementation that is costly and may introduce errors.

European Patent EP0910802 (Lenssen) provides a magnetic field sensor comprising: resistive elements in a Wheatstone bridge configuration. At least one element is a magneto-resistive device. A measurement current is passed from a first point through the bridge to a second point. A conductive track runs in proximity to but is electrically insulated from the resistive elements for the magnetically biasing the resistive elements with a biasing current. The second point is electrically connected to the conductive track so that the measurement current is also employed as the biasing current.

European Patent EP0760931 (Andrae, et al.) describes a sensor for sensing at least one of angular position and rotation speed. The sensor includes a permanent magnet rotatable about an axis of rotation and at least three Wheatstone bridges each having four bridge resistors formed of magneto-resistive strip lines extending in planes parallel to a rotation plane of the permanent magnet. The bridge resistors of each of the Wheatstone bridges are disposed on respective sides of quadrangles corresponding to the respective Wheatstone bridges. Each Wheatstone bridge has two adjacently arranged bridge resistors connected to a half-bridge of the Wheatstone bridges. The quadrangles are disposed relative to one another rotated by a preselectable angle. The three Wheatstone bridges each have an intersection point of virtual diagonals connecting corners of respective ones of the quadrangles, the intersection points being arranged substantially concentrically about the axis of rotation, and the three Wheatstone bridges are disposed so as to be equally and evenly swept by a field of the permanent magnet during rotation thereof to saturate the bridge resistors.

European Patent EP1481256 (Wan, et al.) provides an integrated magnetic field sensing device that includes at least two magneto-resistive elements. The magneto-resistive elements are biased in one direction by an integral conductor and are sensitive to magnetic field components in a direction perpendicular to the one direction. The sensitivity of the device to a magnetic field is adjustable and is related to the level of the bias current. In a current measuring application, two of the magnetic field sensing devices are mounted on opposite sides of and perpendicular to a conductor carrying a current to be measured. In a portable current measuring apparatus, two of the magnetic field sensors are mounted in a housing that assists in locating the magnetic field sensors relative to the conductor carrying the current to be measured.

U.S. Pat. No. 5,764,567 (Parkin) describes a magnetic tunnel junction (MTJ) device, an external magnetic field sensor. The MTJ device has a tunneling magneto-resistance response, as a function of applied magnetic field, that is substantially symmetric about zero field. The magnetic tunnel junction is made up of two ferromagnetic layers, one of which has its magnetic moment fixed and the other of which has its magnetic moment free to rotate, an insulating tunnel barrier layer between the ferromagnetic layers for permitting tunneling current perpendicularly through the layers, and a nonferromagnetic layer located at the interface between the tunnel barrier layer and one of the ferromagnetic layers. The nonferromagnetic layer increases the spacing between the tunnel barrier layer and the ferromagnetic layer at the interface and thus reduces the magnetic coupling between the fixed and free ferromagnetic layers, which has been determined to be the cause of unsymmetric tunneling magneto-resistance response about zero field. Even though the nonferromagnetic interface layer presents nonspin-polarized electronic states at the tunnel barrier layer interface, it unexpectedly does not cause a suppression of the tunneling magneto-resistance.

U.S. Pat. No. 6,011,390 (Loreit, et al.) describes a sensor chip with magneto-resistive Wheatstone bridges for determining magnetic field directions. The arrangement for a magneto-resistive sensor chip has two Wheatstone bridges to determine the sine and cosine of the angle formed between a chip edge and the direction of the magnetic field. All resistances of the bridges consist of a plurality of magneto-resistive laminated elements with current connections made of highly conductive thin films with parallel edges. When the resistances of a bridge are directly electrically interconnected, these edges form angles of 90° each. The parallel edges of the corresponding resistances of the sine and cosine bridges are mutually offset by 45°. The magneto-resistive laminated elements are distributed on the chip surface to reduce angle measurement errors to a minimum.

U.S. Pat. No. 6,100,686 (Van Delden, et al.) illustrates a magnetic field sensor with double Wheatstone bridge having magneto-resistive elements. The magnetic field sensor has a substrate on which a plurality of resistive elements form a double Wheatstone bridge circuit, at least one of the resistive elements in each bridge having a magneto-resistive characteristic. The two bridges are identical except in that, if a given magneto-resistive element in a given branch in one bridge has a positive output polarity, then the corresponding magneto-resistive element in the same branch in the other bridge will have a negative output polarity. By adding the output signals of the two Wheatstone bridges a zero-point offset of the sensor can be determined and eliminated. There is no need to employ the so-called flipping technique employed for that purpose in conventional sensors, which requires increased power consumption.

U.S. Pat. No. 6,633,462 (Adelerhof) teaches a magneto-resistive angle sensor which determines a magnetic field direction with a high angular accuracy over a wide range of magnetic field strengths. The magneto-resistive angular sensor includes a main sensing element which is electrically connected to a two correction sensing elements. The first correction sensing element has a first reference magnetization axis and the second correction sensing element has a second reference magnetization axis. The first and the second reference magnetization axes make correction angles $\theta$ between 5° and 85° of opposite sign with a main reference axis.

U.S. Pat. No. 6,756,782 (Van Zon) describes a magnetic field measuring sensor having a shunt resistor and method of regulating the sensor. The sensor for measuring a magnetic field includes a substrate, four magnetic elements arranged in a bridge configuration on the substrate, a first bridge portion. The two elements are connected in series, a second bridge portion, and a third element and a fourth element are connected in series, being situated between a first contact and a second contact. The first bridge portion includes an electrical shunt resistor, which is arranged parallel to the first magnetic element of the bridge. In order to compensate for offset voltage and offset voltage drift in the output voltage of the bridge configuration, the temperature coefficient of the shunt resistor compensates for the variation of the temperature coefficients of the magnetic elements in the bridge.

U.S. Pat. No. 6,771,472 (Mao, et al.) provides a magnetic sensor having a first opposing pair and a second opposing pair of resistive elements configured in a Wheatstone bridge, wherein the resistive elements are a synthetic antiferromagnetic giant magneto-resistive sensor having a reference layer and a pinned layer of different thicknesses. The first opposing pair has a net magnetic moment that is opposite to that of the second opposing pair, and the first opposing pair has a thicker reference layer than pinned layer, and the second opposing pair has a thicker pinned layer than reference layer.

U.S. Pat. No. 6,891,368 (Kawano, et al.) describes a magneto-resistive sensor device formed on a substrate with a sensing portion and a signal processing circuit. The sensing portion detects changes in a magnetic field induced by a moving body, is located at a position for effectively detecting changes in a magnetic field induced by the moving body, and is constituted by a magneto-resistive sensor element having a Wheatstone bridge configuration.

U.S. Pat. No. 6,992,869 (Suzuki, et al.) illustrates a magnetic resistance device having a high magnetic resistance change rate, satisfactory production yield and a low level of variation in production. The device has a pair of magnetic tunnel resistance devices employing a laminated structure comprised of antiferromagnetic film, lower magnetic layer, barrier film and upper magnetic layer. The pair of magnetic tunnel resistance devices are formed connected in series on substrate.

U.S. Pat. No. 7,054,114 (Jander, et al.) provides a ferromagnetic thin-film based magnetic field sensor with first and second sensitive direction sensing structures. The direction sensing structures each have a nonmagnetic intermediate layer with two major surfaces on opposite sides thereof having a magnetization reference layer on one and an anisotropic ferromagnetic material sensing layer on the other. The direction sensing structures have a length and a smaller width. The width is placed parallel to the relatively fixed magnetization direction. The relatively fixed magnetization direction of the magnetization reference layer in the direction sensing structures is oriented substantially parallel to the substrate but substantially perpendicular to that of the other direction sensing structures. An annealing process is used to form the desired magnetization directions.

SUMMARY OF THE INVENTION

An object of this invention is to provide to provide magnetic field angle sensor for measurement of a magnetic field angle over a 360° range of measurement.

Another object of this invention is to provide magnetic tunnel junction elements oriented at multiple angles with their pinned magnetization oriented to the angle of the magnetic tunnel junction.

To accomplish at least one of these objects a magnetic field angle sensor includes multiple magnetic tunnel junction elements formed on a bottom electrode. Each magnetic tunnel junction element has an anti-ferromagnetic material deposited on the bottom electrode. A pinned synthetic multiple layer is formed on the antiferromagnetic material. A tunneling barrier layer formed on the pinned synthetic multiple layer. A free layer is formed on the tunneling barrier layer. A protective cap layer is formed on the free layer. The magnetic tunnel junction elements are then patterned such that each magnetic tunnel junction element has a large dimensional aspect ratio and has large anisotropies in each of the pinned synthetic multiple layer of the plurality of magnetic tunnel junction elements. The magnetic tunnel junction elements are then annealed for a first time in the presence of a strong magnetic field in a direction of the reference axis. The magnetic tunnel junction elements are annealed at a temperature of from approximately 200° C. to approximately 300° C. for a period of between 5 minutes and 100 minutes in the presence of a very large magnetic field of greater than approximately 1000 Gauss. The very large magnetic field is oriented in the direction (X).

The magnetic tunnel junction elements is annealed for a second time with no external magnetic field so that exchange pinning is reduced to almost zero and strong stress induced anisotropies of the pinned synthetic multiple layer align anneal magnetization of the pinned synthetic multiple layer along a long axis of each of the magnetic tunnel junction elements. The magnetic tunnel junction elements are annealed at a temperature of from approximately 200° C. to approximately 250° C. for a period of between 5 minutes and 100 minutes in the presence of no magnetic field.

The magnetic tunnel junction elements are formed into three types of orientations. The first type of magnetic tunnel junction elements is oriented to have their long axis placed at a first angle from the direction of the reference axis. The second type of magnetic tunnel junction elements is oriented to have their long axis placed at a 0° from the direction of the reference axis. The third type of magnetic tunnel junction elements is oriented to have their long axis placed at a second angle from the direction of the reference axis. The first angle has an absolute value equal to the second angle and has an opposite sign to the second angle. The absolute values for the first and second angles are from approximately 15° to approximately 65°.

The long axis of magnetic tunnel junction elements is perpendicular to a top electrode and a bottom electrode connected to each of the plurality of magnetic tunnel junction elements. Alternately, the long axis of each of the plurality of magnetic tunnel junction elements is parallel to the top electrode and the bottom electrode connected to each of the plurality of magnetic tunnel junction elements.

The magnetic field angle sensor is formed by connecting the magnetic tunnel junction elements to form a first Wheatstone bridge and a second Wheatstone bridge. In the presence of no external magnetic field a first differential measurement voltage level developed between a first pair of opposing terminals of the first Wheatstone bridge and a second differential measurement voltage level developed between a first pair of opposing terminals of the second Wheatstone bridge are zero volts.

A first branch of the first Wheatstone bridge comprises at least one of the first type of magnetic tunnel junction elements. A second branch of the first Wheatstone bridge connected to the first branch comprises at least one of the third type of magnetic tunnel junction elements. A third branch of the first Wheatstone bridge comprises at least one of the third type of magnetic tunnel junction elements. And a fourth branch of the first Wheatstone bridge connected to the third branch comprises at least one of the first type of magnetic tunnel junction elements.

A first branch of the second Wheatstone bridge comprises at least one of the first type of magnetic tunnel junction elements serially connected with at least one of the third type of magnetic tunnel junction elements. A second branch of the second Wheatstone bridge connected to the first branch comprises at least one of the second type of magnetic tunnel junction elements. A third branch of the second Wheatstone bridge comprises at least one of the second type of magnetic tunnel junction elements. And a fourth branch of the second Wheatstone bridge connected to the third branch comprises at least one of the first type of magnetic tunnel junction elements serially connected with at least one of the third type of magnetic tunnel junction elements.

A power supply voltage source is connected between a second pair of opposing terminals of each Wheatstone bridge to provide a biasing voltage for the two Wheatstone bridges. The first differential measurement voltage level and the second differential measurement voltage level are equalized to have approximately equivalent amplitude and the magnetic field angle is determined by the equation:

$$\theta = \arctan\left(\frac{\Delta U_1}{\Delta U_2}\right)$$

where:

$\Delta U_1 = A \sin(\theta)$, $\Delta U_2 = A \cos(\theta)$,

θ is the magnetic field angle, and

A is the equalized equivalent amplitude of the first and second differential measurement voltage levels.

The pinned synthetic multiple layer is formed of a pinned magnetic layer placed directly on the anti-ferromagnetic material, a spacer layer placed on the pinned magnetic layer, and a reference layer placed on the spacer layer. The pinned magnetic layer is a soft magnetic material with a first magnetostriction constant being positive or approaching a zero level. The soft magnetic material is selected from the group of soft magnetic materials consisting of Ni, Fe, Co, or B.

The spacer layer comprises a non-magnetic material such as Ru, Rh, and Cr. The reference layer comprises a material with a large positive magnetostriction constant such as CoFeB, CoFe or multiple layered structures of CoFeB and CoFe.

The anti-ferromagnetic material is IrMn, PtMn, FeMn, NiO, or any material having magnetically oriented anti-parallel sub-lattices.

DETAILED DESCRIPTION OF THE INVENTION

Figure 1:
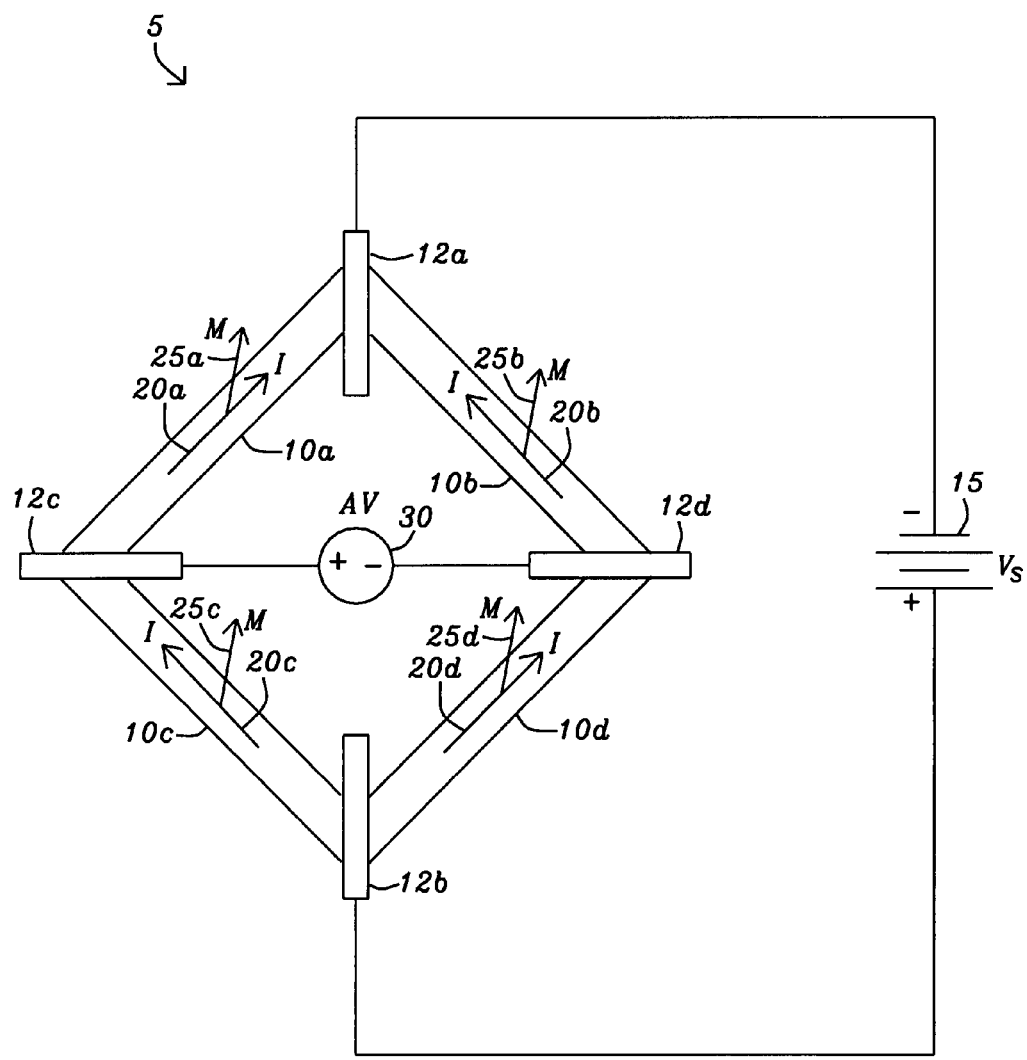
FIG. 1 is diagram of a Wheatstone bridge configured magnetic field angle sensor of the prior art.

A magnetic field angle sensor of this invention provides for measurement of a 360° magnetic field angle. The magnetic field angle sensor includes multiple magnetic tunnel junction elements formed on a single substrate. The magnetic tunnel junction elements are structured in arrays of multiple magnetic tunnel junction elements with identical geometries except with differing orientations. All magnetic tunnel junction element arrays are made with exact the same geometries and the same processing. In each array, there are the same number of magnetic tunnel junction elements have a large dimensional aspect ratio preferably with an elliptical shape. The dimensional aspect ratio being the ratio of the length of the magnetic tunnel junction elements or the top and bottom electrodes to the width of the magnetic tunnel junction elements or the top and bottom electrodes. The arrays of magnetic tunnel junction elements are connected in parallel between a top and a bottom conductor leads. Each array of magnetic tunnel junction elements is oriented at an angle in rotation from others. One array type (A) has a negative angle from a reference axis, a second array type (B) has an orientation parallel to the reference axis, and a third array type (C) has an orientation has a positive angle from the reference angle. Preferably, the three orientations are: −45° for the first array type (A), 0° for the second array type (B) and +45° for the third array type (C).

The magnetic field angle sensor is formed of two four-branched Wheatstone bridges to measure the magnetic field angle. The orientation of the arrays of magnetic tunnel junction elements are structured such that with no magnetic field impinging upon the magnetic field angle sensor, the voltage developed between two opposing branches of the two Wheatstone bridges is zero (0). When a magnetic field impinges upon the magnetic field angle sensor, the differential voltage developed between the opposing branches of a first of the two Wheatstone bridges is proportional to the sine function of the angle of the impinging magnetic field and the reference axis. Alternately, the differential voltage developed between the opposing branches of the second of the two Wheatstone bridges is proportional to a cosine function of the angle between the impinging magnetic field and the reference axis. The two differential voltages between the opposing branches of the two Wheatstone bridges are equalized to create signals that have the same amplitude. The two differential signals are then combined such that the arctangent of the quotient of the two differential voltages determines the angle between the impinging magnetic field and the reference axis. The function of the arctangent can be performed as memory maps in microcontroller integrated circuit, the resultant angle of the impinging magnetic field and a current flowing through the magnetic tunnel junction elements of the second Wheatstone bridge is easily obtained by the microcontroller circuit.

As is known in the art, magnetic tunnel junction elements are formed of a tri-layer sandwich consisting of two layers of magnetic material separated by an ultrathin insulating layer. If a voltage is applied to the top and bottom of this structure, classical physics does not allow a current to flow; however, if the insulating layer, also referred to as the barrier layer, is sufficiently thin, electrons can flow by quantum mechanical tunneling through the barrier layer. For tunneling between the two magnetized materials, the tunneling current is maximum if the magnetization directions of the two electrodes are parallel and minimum if they are aligned antiparallel. The tunneling current, and thus the resistance of the device, changes as external magnetic fields alter the magnetic orientation of these two electrodes.

In order to achieve a linear, bipolar operation, one of the two magnetic electrodes (the pinned layer) in each sensor has its magnetization fixed. The remaining electrode (the free layer) is left free to respond to external fields. The magnetic reference layers are pinned by an anti-ferromagnetic layer (AFM) through thermal annealing. Each top/bottom conductor leads have rectangle shapes with very large dimensional aspect ratio, which causes a large value of stress level in the magnetic tunnel junction elements. Normally, because a tensile stress is induced on their sandwiched MTJ elements along conductor short width direction, their synthetic pinned layers consist of highly positive magnetostrictive material and short axes of sandwiched multiple magnetic tunnel junction elements are arranged to be along their central line. For the anti-ferromagnetic layer (AFM) setting, the first thermal annealing is conducted with applying strong magnetic field along the reference direction after full film deposition of the magnetic tunnel junction elements. Then film of the magnetic tunnel junction elements is patterned to describe the geometry and orientations of the magnetic tunnel junction elements. The top conducting leads are deposited and patterned inducing large anisotropies in each pinned layers along their long axes by large stress levels. Each top and bottom conducting leads have rectangular shapes with very large dimensional aspect ratios. A second thermal annealing without external field is briefly conducted to reduce the exchange pinning field to almost zero. The strong stress induced anisotropies of pinned layers align the magnetizations in pinned layers along their nearby magnetic tunnel junction element long axis directions for each type of magnetic tunnel junction element arrays. After the second thermal annealing is finished, magnetizations of pinned layers are pinned by AFM along each MTJ long axis direction. Therefore, pinned directions from the three type (A, B, and C) arrays are set to be −45°, 0°, and +45° away from the reference axis, respectively.

Figure 2:
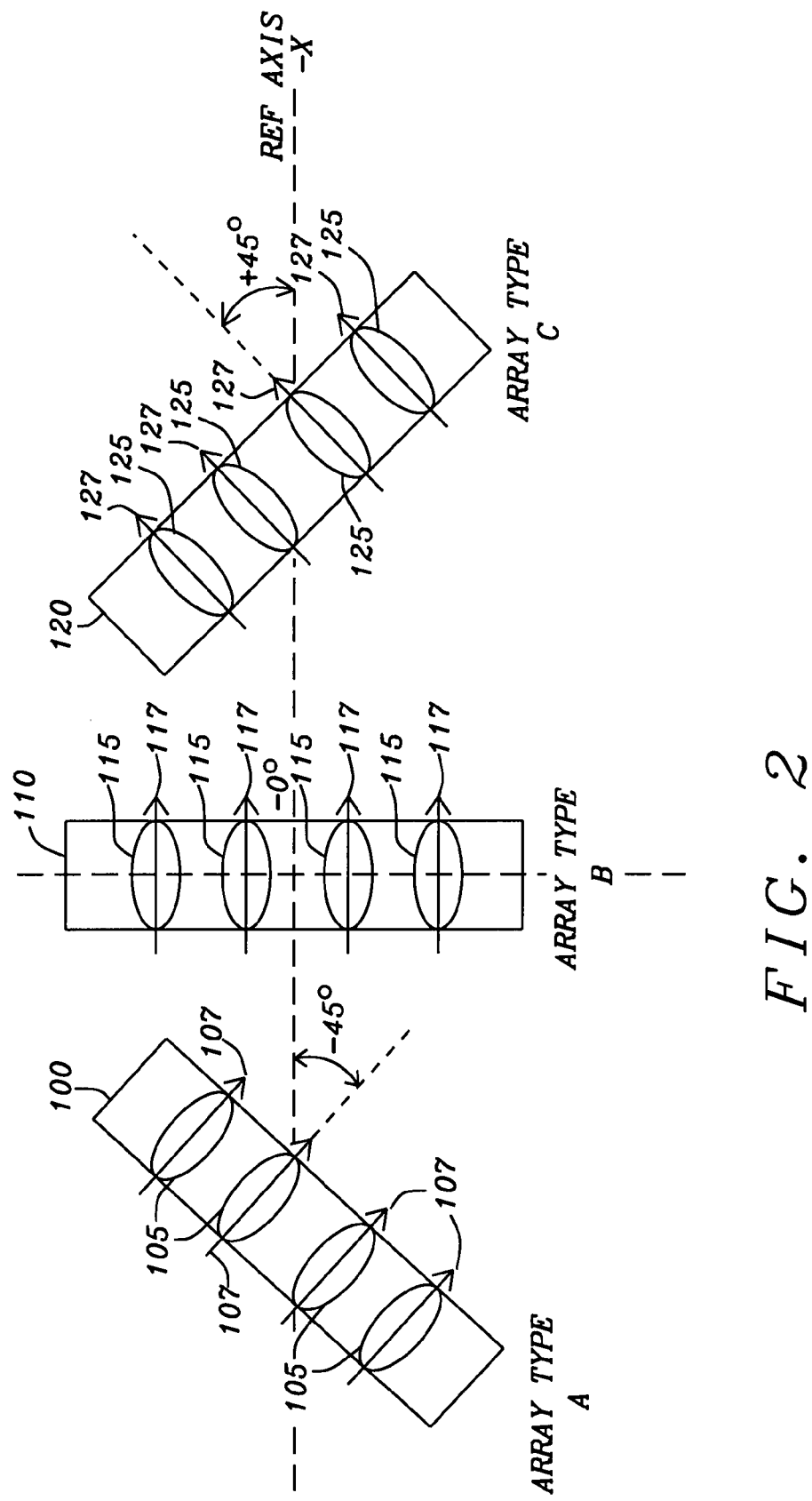
FIG. 2 is a diagram of magnetic tunnel junction elements incorporated in the magnetic field angle sensor of this invention.

Refer now to FIG. 2 for a more detailed description of the array structure for the magnetic tunnel junction elements of the magnetic field angle sensor of this invention. The first type array (A) 100 includes multiple magnetic tunnel junction elements 105 connected together in parallel by top and bottom electrodes. The reference magnetic layer of each of the magnetic tunnel junction elements 105 are pinned in an orientation at a first angle (−45°) 107 to the reference axis (X). The second type array (B) 110 includes multiple magnetic tunnel junction elements 115 connected together in parallel by top and bottom electrodes. The reference magnetic layer of each of the magnetic tunnel junction elements 115 are pinned in an orientation that is parallel (0°) 117 to the reference axis (X). The third type array (C) 120 includes multiple magnetic tunnel junction elements 125 connected together in parallel by top and bottom electrodes. The reference magnetic layer of each of the magnetic tunnel junction elements 105 are pinned in an orientation at a second angle (+45°) 107 to the reference axis (X). The first and second angles are complementary about the reference axis (X) and have a range of absolute values of from approximately 15° to approximately 65°.

Figure 3:
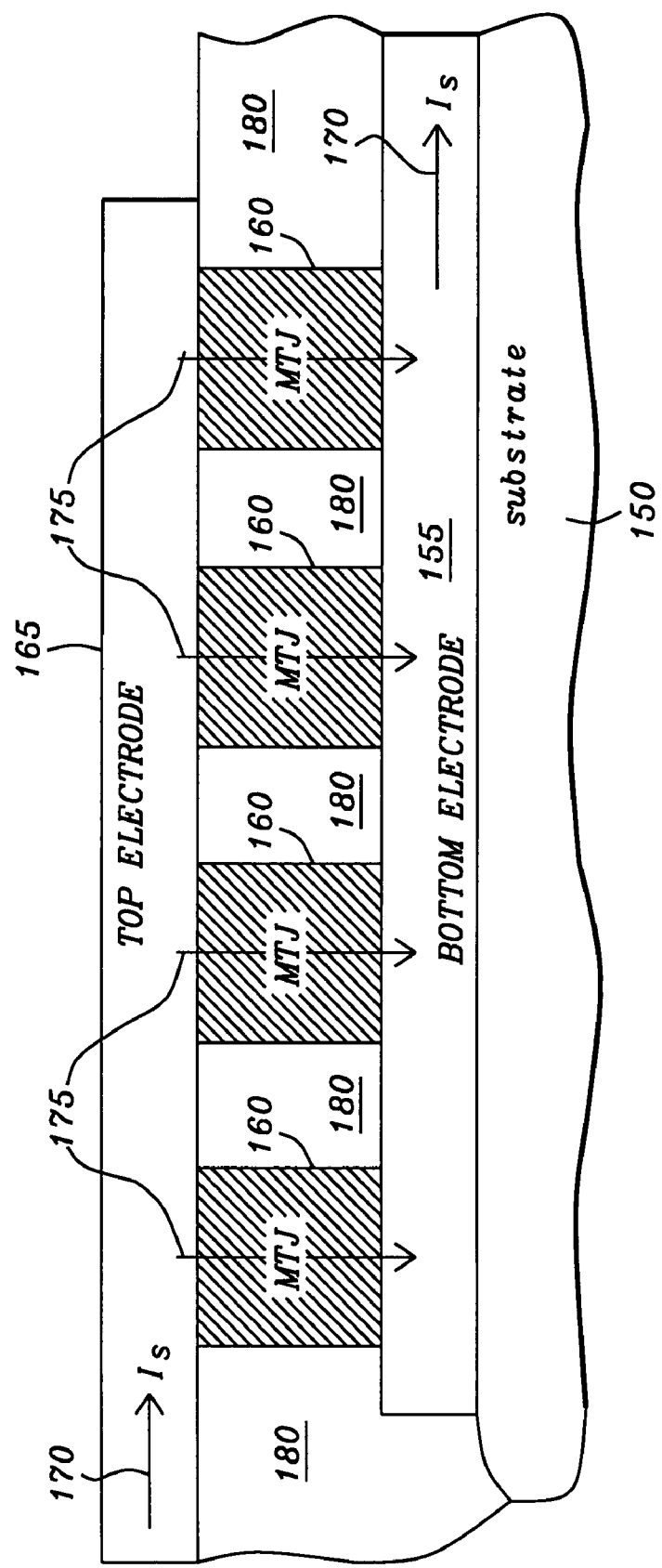
FIG. 3 is a cross-sectional view of an array of magnetic tunnel junction elements of the magnetic field angle sensor of this invention.

FIG. 3 shows a cross-section of the arrays of the magnetic tunnel junction elements incorporated in the magnetic field angle sensor of this invention. A bottom electrode 155 is deposited and formed on a substrate 150. The magnetic tunnel junction element structures 160 are patterned into small cells with ellipse-shape between the top electrode 165 and bottom electrodes 155. These magnetic tunnel junction elements have identical shapes with the same orientation direction or the same long axis direction and are connected to be electrically parallel between the top electrode 165 and bottom electrodes 155. During sensing operation, the total-electric current 170 is divided into the same amount of current 175 flowing through these identical magnetic tunnel junction elements 160. When a magnetic field is present, these magnetic tunnel junction elements 160 give their signal responses, and the total signal from this sensor is the averaged signal among its multiple magnetic tunnel junction elements 160.

Figure 4A:
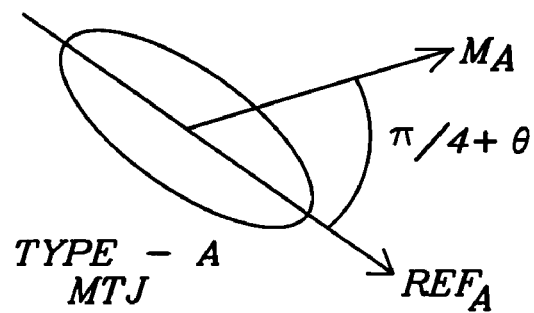
FIGS. 4a-4c are diagrams of the magnetic tunnel junction element orientations in the magnetic field angle sensor of this invention.
Figure 4B:
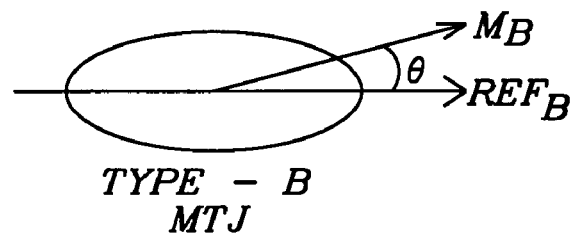
Figure 4C:
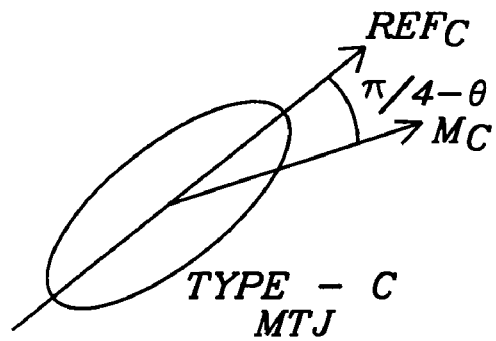
Figure 5:
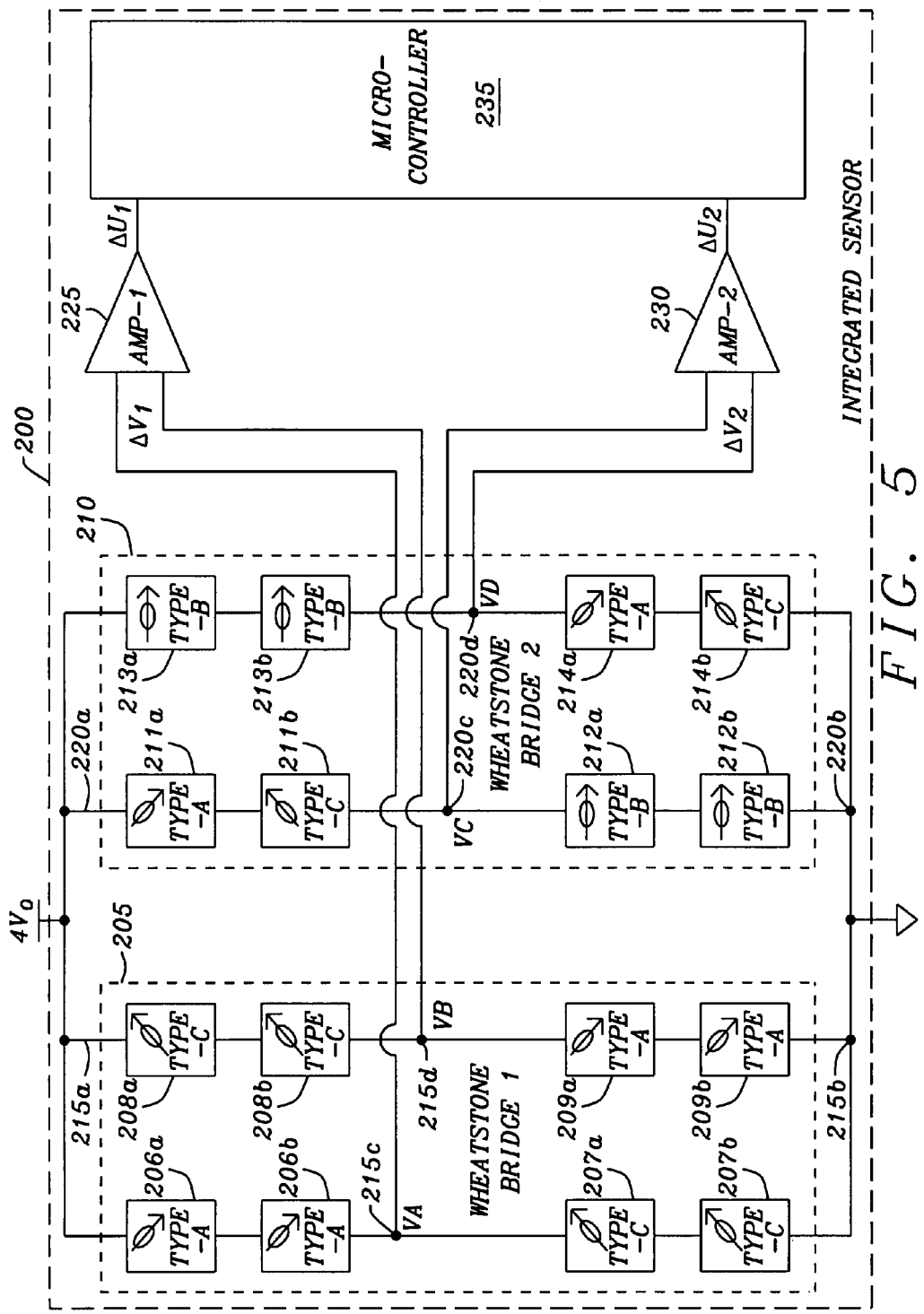
FIG. 5 is a schematic diagram of a Wheatstone configured magnetic field angle sensor of this invention.

Refer now to FIGS. 4a- 4c for a discussion of the derivation of the angle of the magnetic moment of the applied magnetic field with respect to the magnetic moment ($REF_A$, $REF_B$, and $REF_C$) of the pinned reference layer of the magnetic tunnel junction elements of the magnetic field angle sensor of this invention. During magnetic field angle sensing, the magnetic field is large enough to saturate and align all magnetic tunnel junction element's free layer magnetizations ($M_A$, $M_B$, and $M_C$) in the same field direction. Respectively, resistances for these three types of MTJ arrays are:

$$R_A = R + \partial R \cdot \frac{1 - \cos(\frac{\pi}{4} + \theta)}{2}$$

$$R_B = R + \partial R \cdot \frac{1 - \cos(\theta)}{2}$$

$$R_C = R + \partial R \cdot \frac{1 - \cos(\frac{\pi}{4} - \theta)}{2}$$

where
R represents the resistance when the free layer magnetization and pinned reference layer magnetization are parallel,
∂R represents the resistance change when the free layer magnetization changes to be anti-parallel to the pinned reference layer magnetization.
θ is the angle between the reference axis (X) and the magnetic moment of the applied The arrays of magnetic tunnel junction elements of FIG. 2 are disposed upon a substrate and configured to form the magnetic field angle sensor as described in FIG. 5. The magnetic field angle sensor 200 is composed to two Wheatstone bridges 205 and 210. The first leg of the first Wheatstone bridge 205 has two of the first type arrays (A) of magnetic tunnel junction elements 206a and 206b serially connected together. The second leg of the first Wheatstone bridge 205 has two of the third type arrays (C) of magnetic tunnel junction elements 207a and 207b serially connected together. Similarly, the third leg of the first Wheatstone bridge 205 has two of the third type arrays (C) of magnetic tunnel junction elements 208a and 208b serially connected together. The fourth leg of the first Wheatstone bridge 205 has two of the first type arrays (A) of magnetic tunnel junction elements 208a and 208b serially connected together.

The first leg of the second Wheatstone bridge 210 has one of the first type arrays (A) of magnetic tunnel junction elements 211a and one of the third type of magnetic tunnel junction elements 211b serially connected together. The second leg of the second Wheatstone bridge 210 has two of the second type arrays (B) of magnetic tunnel junction elements 212a and 212b serially connected together. Similarly, the third leg of the second Wheatstone bridge 210 has two of the second type arrays (B) of magnetic tunnel junction elements 213a and 213b serially connected together. The fourth leg of the second Wheatstone bridge 210 has one of the first type arrays (A) of magnetic tunnel junction elements 214a and one of the third type of magnetic tunnel junction elements 214b serially connected together.

A power supply voltage source ($4V_O$) is connected to the junction of the terminals 215a and 220a and the ground reference point is connected to the junction of the terminals 215b and 220b. The voltages $V_A$, $V_B$, $V_C$, and $V_D$ are determined as the voltage divider of the resistances of the associated connected branches from the power supply voltage source ($4V_O$) and the ground reference point. The voltages $V_A$, $V_B$, $V_C$, and $V_D$ are thus determined by the equations:

$$V_A = \frac{(4V_o)R_A}{(R_A + R_C)}$$

Where:
$V_A$ is the voltage at the terminal 215c.
$R_A$ is the resistance of the first type arrays (A) of magnetic tunnel junction elements 206a and 206b.
$R_C$ is the resistance of the Third type arrays (C) of magnetic tunnel junction elements 207a and 207b.
$4V_O$ is the voltage level of the power supply voltage source.

$$V_B = \frac{(4V_o)R_C}{(R_A + R_C)}$$

Where:
$V_B$ is the voltage at the terminal 215d.
$R_A$ is the resistance of the first type arrays (A) of magnetic tunnel junction elements 209a and 209b.
$R_C$ is the resistance of the Third type arrays (C) of magnetic tunnel junction elements 208a and 208b.
$4V_O$ is the voltage level of the power supply voltage source.

$$V_C = \frac{(4V_o) * 2R_B}{(R_A + R_C + 2R_B)}$$

Where:
$V_C$ is the voltage at the terminal 220c.
$R_A$ is the resistance of the first type arrays (A) of magnetic tunnel junction elements 211a.
$R_b$ is the resistance of the second type arrays (B) of magnetic tunnel junction elements 212a and 212b.
$R_C$ is the resistance of the third type arrays (C) of magnetic tunnel junction elements 211b.
$4V_O$ is the voltage level of the power supply voltage source.

$$V_D = \frac{(4V_O)(R_A + R_C)}{(R_A + R_C + 2R_B)}$$

Where:
$V_D$ is the voltage at the terminal 220d.
$R_A$ is the resistance of the first type arrays (A) of magnetic tunnel junction elements 214a.
$R_B$ is the resistance of the second type arrays (B) of magnetic tunnel junction elements 213a and 213b.
$R_C$ is the resistance of the third type arrays (C) of magnetic tunnel junction elements 214b.
$4V_O$ is the voltage level of the power supply voltage source.

The first differential voltage ($\Delta V_1$) is the difference between the voltages $V_A$ and $V_B$. The second differential voltage ($\Delta V_2$) is the difference between the voltages $V_C$ and $V_D$. When there is no applied magnetic field (0 Gauss), the first differential voltage ($\Delta V_1$) and the second differential voltage ($\Delta V_2$) are both zero. With the application of a magnetic field, it can be shown that the first differential voltage ($\Delta V_1$) is determined by the equation:

$$\Delta V_1 = k_1(R_A - R_C) = k_1 \partial R \left( \frac{\cos(\pi/4 - \theta) - \cos(\pi/4 + \theta)}{2} \right) = k_1 \partial R \frac{\sqrt{2}}{2} \sin(\theta)$$

where:
$k_1$ is a constant.
$R_A$ is the resistance of the first type arrays (A) of magnetic tunnel junction elements 214a.
$R_B$ is the resistance of the second type arrays (B) of magnetic tunnel junction elements 213a and 213b.
$\partial R$ represents the resistance change when the free layer magnetization changes to be anti-parallel to the pinned reference layer magnetization.
$\theta$ is the angle between the reference axis (X) and the magnetic moment of the applied.

Further, with the application of a magnetic field, it can be shown that the first differential voltage ($\Delta V_2$) is determined by the equation:

$$\Delta V_2 = k_2((R_A + R_C)/2) - R_B$$

-continued $$= k_2 \partial R \left( \frac{\cos(\theta) - \{\cos(\frac{\pi}{4} - \theta) - \cos(\frac{\pi}{4} + \theta)\}/2}{2} \right)$$

$$= k_2 \partial R \frac{1 - \frac{\sqrt{2}}{2}}{2} \cos(\theta)$$

where:
$k_2$ is a constant.
$R_A$ is the resistance of the first type arrays (A) of magnetic tunnel junction elements 214a.
$R_B$ is the resistance of the second type arrays (B) of magnetic tunnel junction elements 213a and 213b.
$\partial R$ represents the resistance change when the free layer magnetization changes to be anti-parallel to the pinned reference layer magnetization.
$\theta$ is the angle between the reference axis (X) and the magnetic moment of the applied.

As can be seen the magnitude of the first differential voltage ($\Delta V_1$) and second differential voltage ($\Delta V_2$) are different but they are directly dependent upon the sine and cosine of the angle ($\theta$) between the reference axis (X) and the magnetic moment of the applied. The first differential voltage ($\Delta V_1$) is applied to the first amplifier 225 and the second differential voltage ($\Delta V_2$) is applied to the second amplifier 230. The gains of the first amplifier 225 and the second amplifier 230 are adjusted such that the signals $\Delta U_1$ and $\Delta U_2$ have equal magnitude and only vary as a function of the sine for the signal $\Delta U_1$ ($\Delta U_1 = A\sin(\theta)$) and the cosine for the signal $\Delta U_2$ ($\Delta U_2 = A\cos(\theta)$). It can be shown that the angle $\theta$ can be determined as arctangent of the ratios of the signals $\Delta U_1$ and $\Delta U_2$ ($\theta = \arctan(\Delta U_1/\Delta U_2)$). The arctangent function is easily determined using a memory map in a microcontroller circuit. Therefore the signals $\Delta U_1$ and $\Delta U_2$ are the inputs to the microcontroller circuit 235. The resulting angle $\theta$ is an output of the microcontroller circuit 235 or alternately is processed further within the microcontroller circuit 235.

Figure 6:
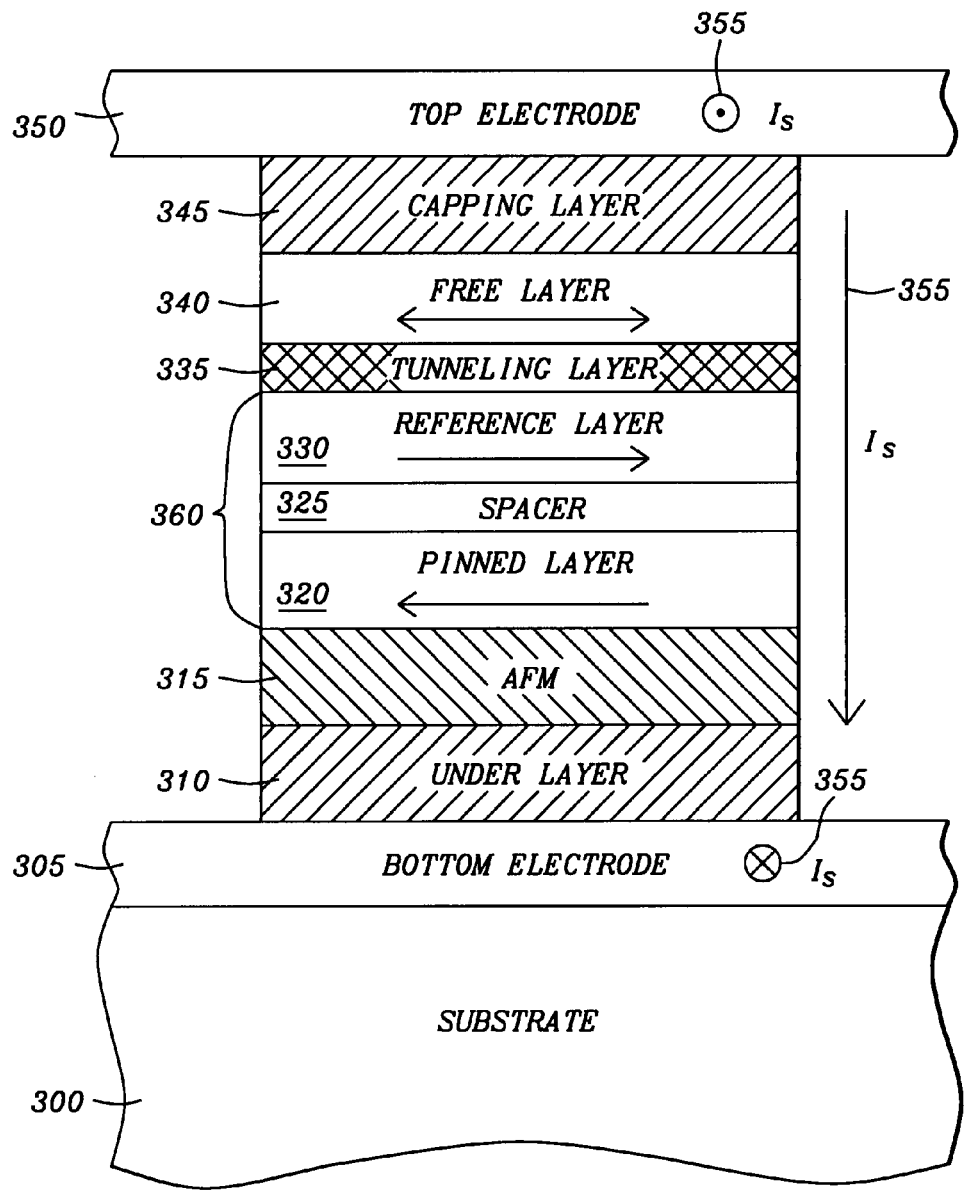
FIG. 6 is cross-sectional view of one magnetic tunnel junction element of the magnetic field angle sensor of this invention.
Figure 7:
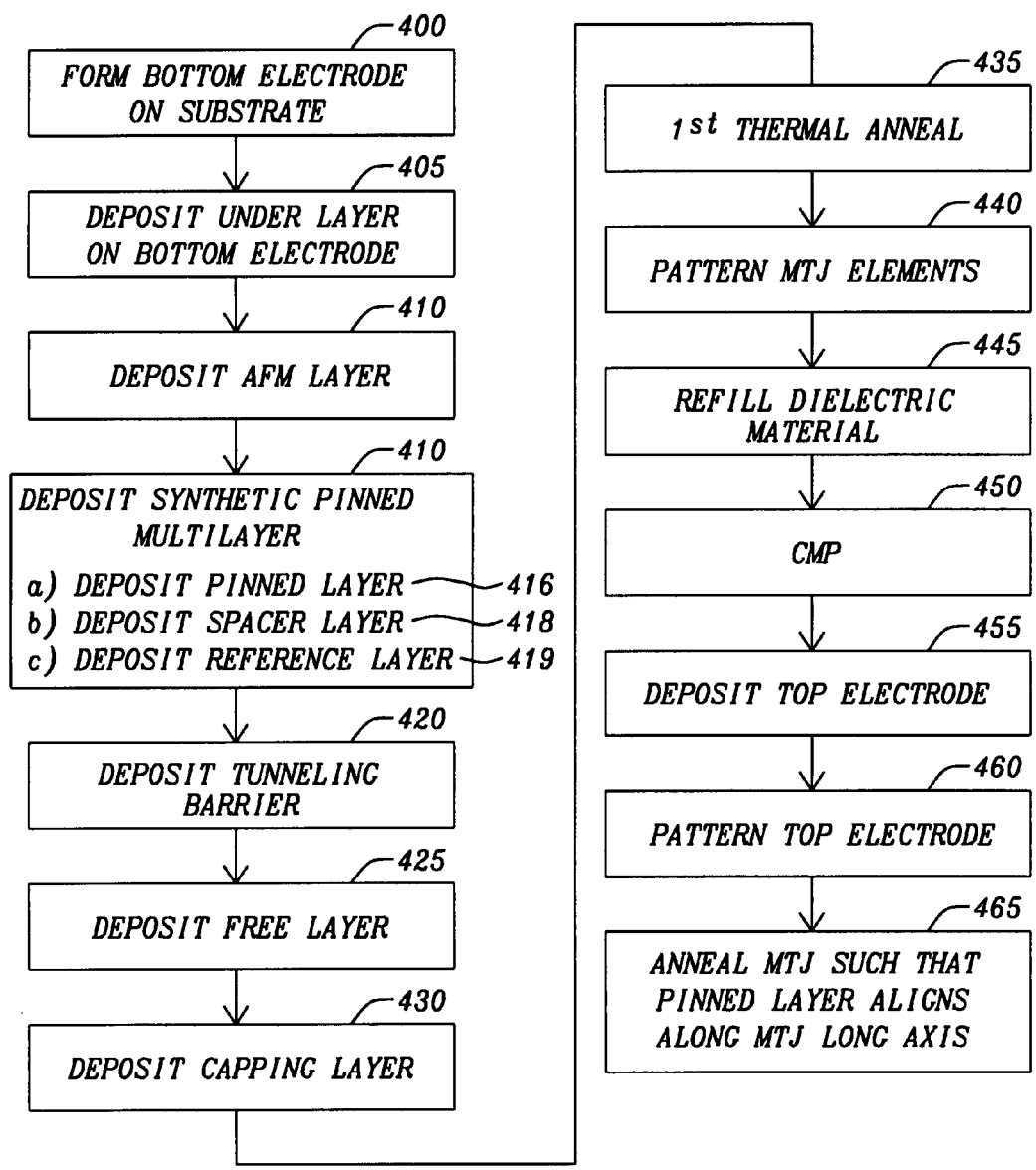
FIG. 7 is process flow diagram for forming the magnetic tunnel junction elements of the magnetic field angle sensor of this invention.

Refer now to FIGS. 6 and 7 for a discussion of the structure and method of construction of one of the magnetic tunnel junction elements of the magnetic field angle sensor of this invention. The magnetic field angle sensor of this invention is fabricated on a single substrate 300. A bottom electrode 305 is deposited (Box 400) and patterned on the substrate 300. A first under-layer 310 is deposited (Box 405) on top of the bottom electrode 305. An anti-ferromagnetic (AFM) layer 315 of compounds such as IrMn, PtMn, FeMn, or NiO is deposited (Box 410) on the under-layer 310. On the anti-ferromagnetic layer a synthetic pinned multi-layer 360 is formed (Box 415) by depositing (Box 416, 417, and 418) a pinned magnetic layer 320, a spacer 325, and a reference layer 330 sequentially on the on the AFM layer 315. The pinned magnetic layer 320 is created by depositing (Box 416) a soft magnetic layer made of magnetic soft alloy of Ni, Fe, Co, B. The soft magnetic alloy also has a large positive magnetostriction constant. The spacer 325 is a non-magnetic layer, preferably a thin layer of materials such as elemental Ru, Rh, or Cr deposited (Box 417) on the pinned magnetic layer 320. The reference layer 330 is formed (Box 418) of alloys of CoFeB, CaFe, or their multi-layer combinations. The reference layer 330 material is selected to have a large positive magnetostriction constant.

A dielectric material such as $AlO_x$, $AlN_x$, $AlN_xO_y$, or $MgO_x$ is deposited (Box 420) to form a tunneling barrier 325. On the tunneling barrier soft magnetic material with near zero magnetostriction constant such as NiFe, or other magnetic soft alloy of Ni, Fe, Co, B is deposited (Box 425) to a thickness of between 1.5 nm and 5 nm to form the free layer 340. The free layer 340 may be formed of a synthetic structure with multiple separate smaller free layers separated by a spacer layer. The separate free layers are made of magnetic soft alloys of Ni, Fe, Co, B. The spacer layer being formed of materials such as Ru, or, Rh, Cr.

A capping layer 345 is deposited (Box 430) on the free layer. The substrate with the full thin film deposition to form the magnetic tunnel junction elements is then annealed (Box 435) at a temperature of from approximately 200° C. to approximately 300° C. for a period of between 5 minutes and 100 minutes in the presence of a very large magnetic field of greater than approximately 1000 Gauss. The very large magnetic field is oriented in the direction of the reference axis (X).

Using standard photolithography patterning processes, the magnetic tunnel junction element film is patterned (Box 440) to form the multiple small magnetic tunnel junction elements with shapes having a large dimensional aspect ratio. Elliptical shapes that have both their short axis and exchange anisotropic ferromagnetically pinned direction (through the first thermal annealing (Box 435) within a large magnetic field) parallel to the conductor 305 and 350 current 355 induced field direction are preferred. However, rectangular and other shapes with large dimensional aspect ratios may be used. Subsequent to the patterning (Box 440) of the magnetic tunnel junction elements, the spaces between the magnetic tunnel junction elements is refilled (Box 445) with a dielectric material 180 of FIG. 3 and a chemical/mechanical polishing (CMP) process is performed (Box 450) on the surface of surface of the substrate 300 onto which the magnetic tunnel junction elements are formed. A top electrode 350 is deposited (Box 455) and patterned (Box 460) to connect all magnetic tunnel junction elements.

In the patterning (Box 440) of the magnetic tunnel junction elements, the arrays of the first type (A), second type (B), and third type (C) of magnetic tunnel junction elements as shown in FIG. 2 have at least one to preferably more than ten magnetic tunnel junction elements between bottom electrode 305 and top electrode 350. As noted previously, the patterning (Box 440) of the magnetic tunnel junction elements, the arrays of the first type (A), second type (B), and third type (C) of magnetic tunnel junction elements as shown in FIG. 2 are oriented such that the angles for the first type (A) of magnetic tunnel junction element and the third type (C) of the magnetic tunnel junction element are oriented at a complementary angles to the reference axis and the complementary angles have a range of from approximately 15° to approximately 65°.

The patterning process (Box 460) of the top electrode 350 generates a large tensile stress on each of the magnetic tunnel junction elements normal to conducting electrode's 350 length. The exchange (AFM) pinned direction of the synthetic pinned reference multilayer 360 is set by a second thermal annealing (Box 465) without applying external magnetic field. The magnetic tunnel junction elements are annealed (Box 465) a second time at a temperature of from approximately 200° C. to approximately 250° C. for a period of between 5 minutes and 100 minutes in the presence of no magnetic field. The exchange pinning field is reduced to almost zero, and strong stress induced anisotropies of pinned layers would align magnetizations in pinned layers along their magnetic tunnel junction element long axis directions for magnetic tunnel junction element arrays. After the second thermal annealing is finished, magnetizations of pinned layers are pinned by AFM along each magnetic tunnel junction element long axis direction.

Figure 8:
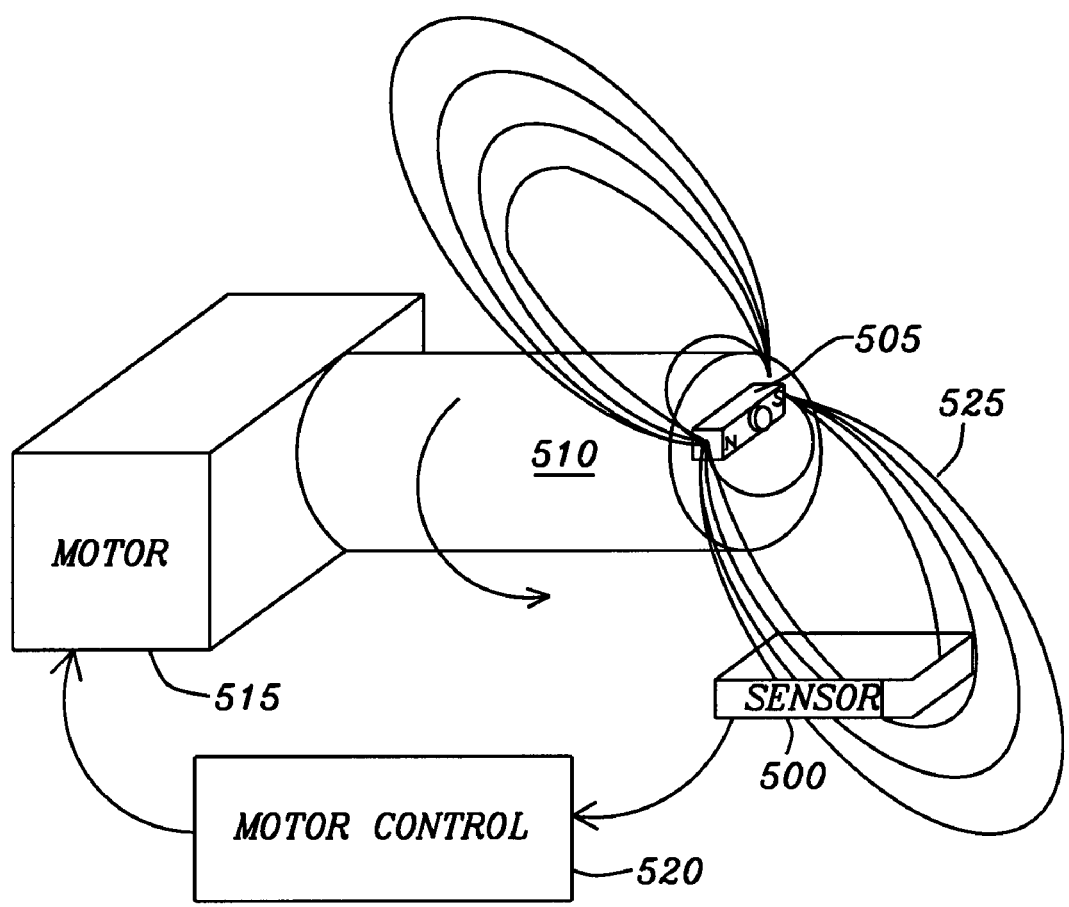
FIG. 8 is a functional block diagram of magnetic field angle detection system incorporating the magnetic field angle sensor of this invention.

Refer now to FIG. 8 for a discussion of an application of the magnetic field angle sensor of this invention. A magnetic field angle sensor 500 of this invention is placed in the field 525 of a magnet 505 that is attached to a shaft 510 of a motor 515. As the shaft 510 rotates, the field 525 rotates and changes its angle of impinging upon the magnetic field angle sensor 500. The magnetic field angle sensor 500 determines the angle of the magnetic field 525 which in turn is employed to determine the angular velocity of the rotation of the shaft 510. This angle of the magnetic field and thus the angular velocity is transferred to the motor control circuit 520 which in turn provides control signals to the motor 515 for controlling the rotation of the shaft 510. The structure of the magnetic tunnel junction elements of the magnetic field angle sensor 500 of this invention eliminates the need for a Hall sensor incorporated in an application as shown.

The application as shown in FIG. 8 is exemplary. Linear motion can be detected and controlled by placing a magnet on a moving structure and monitoring the changes in the magnetic field angles with the magnetic field angle sensor of this invention.

Figure 9A:
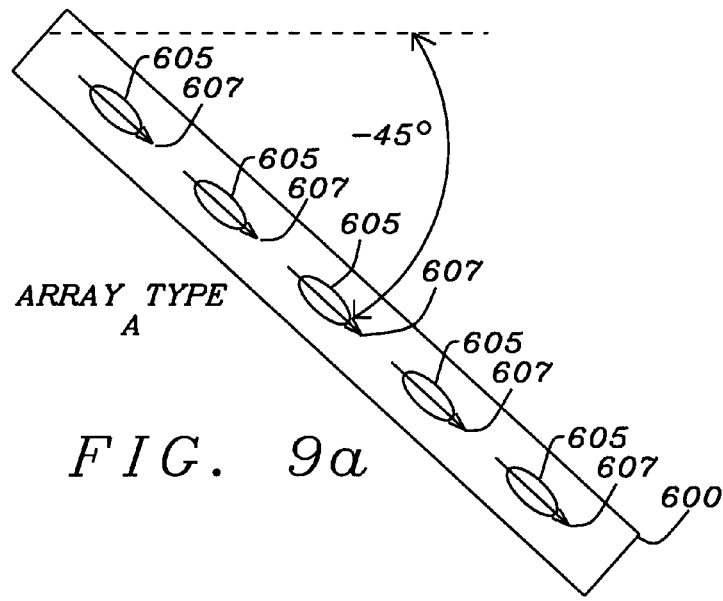
FIG. 9 is a diagram of a second embodiment of the structure of the magnetic tunnel junction elements incorporated in the magnetic field angle sensor of this invention.
Figure 9B:
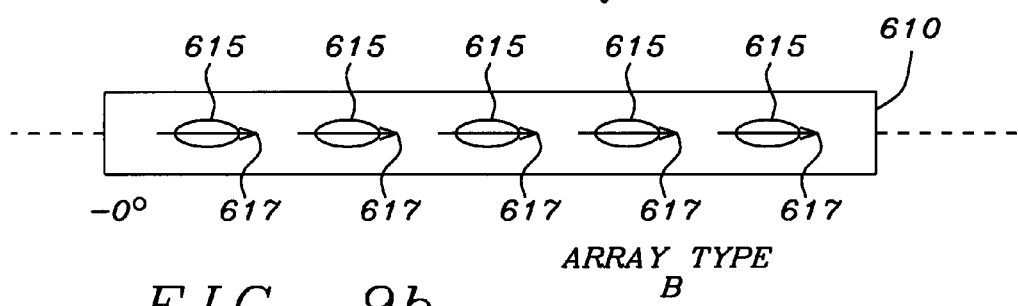
Figure 9C:
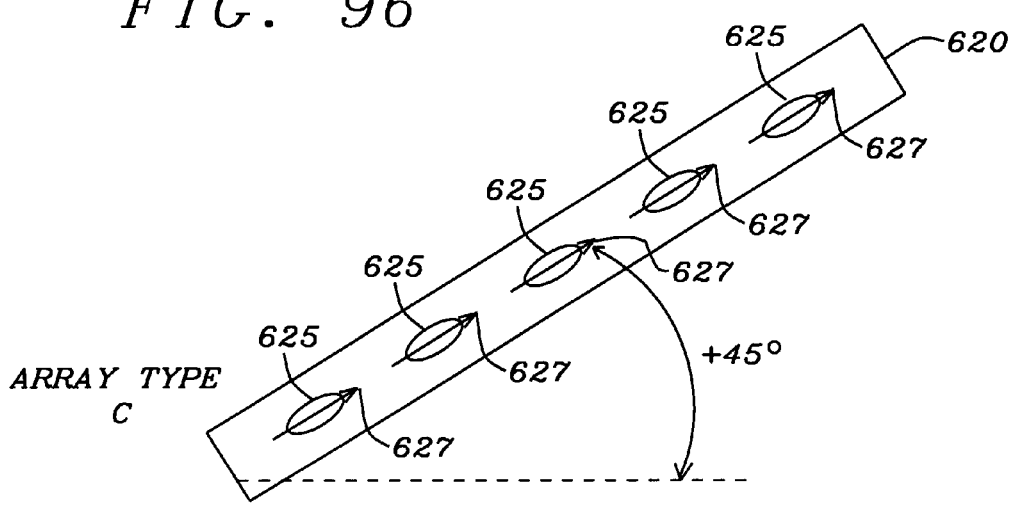

Referring to FIGS. 9a-9c, the arrays 600, 610, and 620 of the magnetic tunnel junction elements 605, 615, and 625, it should be noted, have stress within the layers of the magnetic tunnel junction elements 605, 615, and 625 that could vary by using different dielectric layer materials and processes. If a tensile stress is induced on their sandwiched magnetic tunnel junction elements along the length of the top and bottom electrodes, instead of the short width, the long axes of magnetic tunnel junction elements 605, 615, and 625 are arranged to be along conductor central line of the length of the top and bottom electrodes. This arrangement is used to set a large stress induced anisotropy in pinned layers along magnetic tunnel junction elements long axes for first type (A), second type (B) and third type (B) of the magnetic tunnel junction elements 605, 615, and 625. The direction 607, 617, and 627 of the pinned magnetic layers now is parallel with the direction of the top and bottom electrodes. The thermal annealing processes to set the direction 607, 617, and 627 of the pinned magnetic layers are the same as the case described above.

While this invention has been particularly shown and described with reference to the preferred embodiments thereof, it will be understood by those skilled in the art that various changes in form and details may be made without departing from the spirit and scope of the invention.

The invention claimed is:

1. A magnetic field angle sensor for measurement of a magnetic field angle over a 360° range of measurement, said magnetic field angle sensor comprising:

a plurality of magnetic tunnel junction elements formed on a substrate, each magnetic tunnel junction element comprising:
  an anti-ferromagnetic material deposited on a bottom electrode formed on said substrate; and
  a pinned synthetic multiple layer formed on said antiferromagnetic material;
  wherein said plurality of magnetic tunnel junction elements are annealed for a first time in the presence of a strong magnetic field in a direction of the reference axis;
  wherein said plurality of magnetic tunnel junction elements are then patterned such that each magnetic tunnel junction element has a large dimensional aspect ratio and has large anisotropies in each of said pinned synthetic multiple layer of said plurality of magnetic tunnel junction elements; and
  said plurality of magnetic tunnel junction elements is annealed for a second time with no external magnetic field so that exchange pinning is reduced during said annealing and strong stress induced anisotropies of said pinned synthetic multiple layer align magnetization of said pinned synthetic multiple layer align a long axis of each of said plurality of magnetic tunnel junction elements.

2. The magnetic field angle sensor of claim 1 wherein a first type of said plurality of magnetic tunnel junction elements are oriented to have their long axis placed at a first angle from said direction of the reference axis, a second type of said plurality of magnetic tunnel junction elements are oriented to have their long axis placed at a 0° from said direction of the reference axis, and a third type of said plurality of magnetic tunnel junction elements are oriented to have their long axis placed at a second angle from said direction of the reference axis.

3. The magnetic field angle sensor of claim 2 wherein said first angle has an absolute value equal to said second angle and has an opposite sign to said second angle.

4. The magnetic field angle sensor of claim 3 wherein said absolute values for said first and second angles are from approximately 15° to approximately 65°.

5. The magnetic field angle sensor of claim 2 wherein said plurality of magnetic tunnel junction elements are connected to form a first Wheatstone bridge and a second Wheatstone bridge such that in the presence of no external magnetic field a first differential measurement voltage level developed between a first pair of opposing terminals of said first Wheatstone bridge and a second differential measurement voltage level developed between a first pair of opposing terminals of said second Wheatstone bridge are zero volts.

6. The magnetic field angle sensor of claim 5 wherein a first branch of said first Wheatstone bridge comprises at least one of said first type of magnetic tunnel junction elements.

7. The magnetic field angle sensor of claim 6 wherein a second branch of said first Wheatstone bridge connected to said first branch comprises at least one of said third type of magnetic tunnel junction elements.

8. The magnetic field angle sensor of claim 7 wherein a third branch of said first Wheatstone bridge comprises at least one of said third type of magnetic tunnel junction elements.

9. The magnetic field angle sensor of claim 8 wherein a fourth branch of said first Wheatstone bridge connected to said third branch comprises at least one of said first type of magnetic tunnel junction elements.

10. The magnetic field angle sensor of claim 9 wherein a first branch of said second Wheatstone bridge comprises at least one of said first type of magnetic tunnel junction elements serially connected with at least one of said third type of magnetic tunnel junction elements.

11. The magnetic field angle sensor of claim 10 wherein a second branch of said second Wheatstone bridge connected to said first branch comprises at least one of said second type of magnetic tunnel junction elements.

12. The magnetic field angle sensor of claim 11 wherein a third branch of said second Wheatstone bridge comprises at least one of said second type of magnetic tunnel junction elements.

13. The magnetic field angle sensor of claim 12 wherein a fourth branch of said second Wheatstone bridge connected to said third branch comprises at least one of said first type of magnetic tunnel junction elements serially connected with at least one of said third type of magnetic tunnel junction elements.

14. The magnetic field angle sensor of claim 5 wherein a power supply voltage source is connected between a second pair of opposing terminals of each Wheatstone bridge to provide a biasing voltage for said two Wheatstone bridges.

15. The magnetic field angle sensor of claim 5 wherein said first differential measurement voltage level and said second differential measurement voltage level are equalized to have approximately equivalent amplitude and said magnetic field angle is determined by the equation:

$$\theta = \arctan\left(\frac{\Delta U_1}{\Delta U_2}\right)$$

where:

$\Delta U_1 = A \sin(\theta)$, $\Delta U_2 = A \cos(\theta)$,

θ is the magnetic field angle, and
A is said equalized equivalent amplitude of the first and second differential measurement voltage levels.

16. The magnetic field angle sensor of claim 1 wherein said long axis of each of said plurality of magnetic tunnel junction elements are perpendicular to a top electrode and a bottom electrode connected to each of the plurality of magnetic tunnel junction elements.

17. The magnetic field angle sensor of claim 1 wherein a grouping of said plurality of said magnetic tunnel junction elements are connected in parallel between a top electrode and said bottom electrode such that said top electrode and said bottom electrode are patterned to have a large dimensional aspect ratio such that said top electrode and said bottom electrode have length dimensions oriented perpendicular to a long dimension of each of said grouping of said plurality of said magnetic tunnel junction elements.

18. The magnetic field angle sensor of claim 1 wherein said long axis of each of said plurality of magnetic tunnel junction elements are parallel to said top electrode and said bottom electrode connected to each of the plurality of magnetic tunnel junction elements.

19. The magnetic field angle sensor of claim 1 wherein said anti-ferromagnetic material is selected from the group of anti-ferromagnetic materials consisting of IrMn, PtMn, FeMn, NiO, and any material having magnetically oriented anti-parallel sub-lattices.

20. The magnetic field angle sensor of claim 1 wherein said pinned synthetic multiple layer comprises:
a pinned magnetic layer placed directly on said anti-ferromagnetic material,
a spacer layer placed on said pinned magnetic layer, and
a reference layer placed on said spacer layer.

21. The magnetic field angle sensor of claim 20 wherein said pinned magnetic layer is a soft magnetic material with a first magnetostriction constant selected from a group of magnetostriction constants consisting of a magnetostriction constant approaching a zero level and a magnetostriction constant having a positive magnitude.

22. The magnetic field angle sensor of claim 21 wherein said soft magnetic material is selected from the group of soft magnetic materials consisting of Ni, Fe, Co, and B.

23. The magnetic field angle sensor of claim 20 wherein said spacer layer comprises a non-magnetic material.

24. The magnetic field angle sensor of claim 23 wherein said non-magnetic material is selected from the group of non-magnetic materials consisting of Ru, Rh, and Cr.

25. The magnetic field angle sensor of claim 20 wherein said reference layer comprises a material with a large magnetostriction constant.

26. The magnetic field angle sensor of claim 25 wherein said material with a large magnetostriction constant is selected from a group of materials consisting of CoFeB, CoFe and multiple layered structures of CoFeB and CoFe.

27. The magnetic field angle sensor of claim 1 wherein plurality of magnetic tunnel junction elements are annealed for said first time in the presence of a strong magnetic field in said direction of said reference axis is at a temperature of from approximately 200° C. to approximately 300° C. for a period of between 5 minutes and 100 minutes in the presence of a very large magnetic field of greater than approximately 1000 Gauss oriented in the direction of the reference axis (X).

28. The magnetic field angle sensor of claim 1 wherein said magnetic tunnel junction elements are annealed a second time at a temperature of from approximately 200° C. to approximately 250° C. for a period of between 5 minutes and 100 minutes in the presence of no magnetic field.

29. A magnetic tunnel junction element formed on a substrate responsive to a magnetic field angle perpendicular to a sensing current passing through said magnetic tunnel junction, comprising:
a plurality of magnetic tunnel junction elements formed on a substrate, each magnetic tunnel junction element comprising:
an anti-ferromagnetic material deposited on a bottom electrode formed on said substrate; and
a pinned synthetic multiple layer formed on said antiferromagnetic material;
wherein said plurality of magnetic tunnel junction elements are annealed for a first time in the presence of a strong magnetic field in a direction of the reference axis;
wherein said plurality of magnetic tunnel junction elements are then patterned such that each magnetic tunnel junction element has a large dimensional aspect ratio and has large anisotropies in each of said pinned synthetic multiple layer of said plurality of magnetic tunnel junction elements; and
said plurality of magnetic tunnel junction elements is annealed for a second time with no external magnetic field so that exchange pinning is reduced during said annealing and strong stress induced anisotropies of said pinned synthetic multiple layer align magnetization of said pinned synthetic multiple layer align a long axis of each of said plurality of magnetic tunnel junctions.

30. The magnetic tunnel junction element of claim 29 wherein a plurality of said magnetic tunnel junction elements are joined to form a magnetic field angle sensor for measurement of said magnetic field angle over a 360° range of measurement, wherein each of said plurality of magnetic tunnel junction elements is selectively oriented as:
a first type magnetic tunnel junction element having its long axis placed at a first angle from said direction of the reference axis;
a second type magnetic tunnel junction element having its long axis placed at a 0° from said direction of the reference axis; or
a third type magnetic tunnel junction element having its long axis placed at a second angle from said direction of the reference axis.

31. The magnetic tunnel junction element of claim 30 wherein said first angle has an absolute value equal to said second angle and has an opposite sign to said second angle.

32. The magnetic tunnel junction element of claim 30 wherein said long axis is perpendicular to a top electrode and a bottom electrode joining one grouping of said plurality of said magnetic tunnel junction elements to form a magnetic field angle sensor for measurement of a magnetic field angle over a 360° range of measurement.

33. The magnetic tunnel junction element of claim 30 wherein said long axis is parallel to a top electrode and a bottom electrode joining one grouping said plurality of said magnetic tunnel junction elements to form a magnetic field angle sensor for measurement of a magnetic field angle over a 360° range of measurement.

34. The magnetic tunnel junction element of claim 30 wherein said plurality of magnetic tunnel junction elements are connected to form a first Wheatstone bridge and a second Wheatstone bridge such that in the presence of no external magnetic field a first differential measurement voltage level developed between a first pair of opposing terminals of said first Wheatstone bridge and a second differential measurement voltage level developed between a first pair of opposing terminals of said second Wheatstone bridge are zero volts.

35. The magnetic tunnel junction element of claim 34 wherein a first branch of said first Wheatstone bridge comprises at least one of said first type of magnetic tunnel junction elements.

36. The magnetic tunnel junction element of claim 35 wherein a second branch of said first Wheatstone bridge connected to said first branch comprises at least one of said third type of magnetic tunnel junction elements.

37. The magnetic tunnel junction element of claim 36 wherein a third branch of said first Wheatstone bridge comprises at least one of said third type of magnetic tunnel junction elements.

38. The magnetic tunnel junction element of claim 37 wherein a fourth branch of said first Wheatstone bridge connected to said third branch comprises at least one of said first type of magnetic tunnel junction elements.

39. The magnetic tunnel junction element of claim 38 wherein a first branch of said second Wheatstone bridge comprises at least one of said first type of magnetic tunnel junction elements serially connected with at least one of said third type of magnetic tunnel junction elements.

40. The magnetic tunnel junction element of claim 39 wherein a second branch of said second Wheatstone bridge connected to said first branch comprises at least one of said second type of magnetic tunnel junction elements.

41. The magnetic tunnel junction element of claim 40 wherein a third branch of said second Wheatstone bridge comprises at least one of said second type of magnetic tunnel junction elements.

42. The magnetic tunnel junction element of claim 41 wherein a fourth branch of said second Wheatstone bridge connected to said third branch comprises at least one of said first type of magnetic tunnel junction elements serially connected with at least one of said third type of magnetic tunnel junction elements.

43. The magnetic tunnel junction element of claim 34 wherein a power supply voltage source is connected between a second pair of opposing terminals of each Wheatstone bridge to provide a biasing voltage for said two Wheatstone bridges.

44. The magnetic tunnel junction element of claim 34 wherein said first differential measurement voltage level and said second differential measurement voltage level are equalized to have approximately equivalent amplitude and said magnetic field angle is determined by the equation:

$$\theta = \arctan\left(\frac{\Delta U_1}{\Delta U_2}\right)$$

where:

$\Delta U_1 = A\sin(\theta)$, $\Delta U_2 = A\cos(\theta)$,

θ is the magnetic field angle, and

A is said equalized equivalent amplitude of the first and second differential measurement voltage levels.

45. The magnetic tunnel junction element of claim 29 wherein said absolute values for said first and second angles are from approximately 15° to approximately 65°.

46. The magnetic tunnel junction element of claim 29 wherein a grouping of said plurality of said magnetic tunnel junction elements are connected in parallel between a top electrode and said bottom electrode such that said top electrode and said bottom electrode are patterned to have a large dimensional aspect ratio such that said top electrode and said bottom electrode have length dimensions oriented perpendicular to a long dimension of each of said grouping of said plurality of said magnetic tunnel junction elements.

47. The magnetic tunnel junction element of claim 29 wherein said anti-ferromagnetic material is selected from the group of anti-ferromagnetic materials consisting of IrMn, PtMn, FeMn, NiO, and any material having magnetically oriented anti-parallel sub-lattices.

48. The magnetic tunnel er placed directly on said anti-ferromagnetic material,
a spacer layer placed on said pinned magnetic layer, and
a reference layer placed on said spacer layer.

49. The magnetic tunnel junction element of claim 48 wherein said pinned magnetic layer is a soft magnetic material with a first magnetostriction constant selected from a group of magnetostriction constants consisting of a magnetostriction constant approaching a zero level and a magnetostriction constant having a positive magnitude.

50. The magnetic tunnel junction element of claim 49 wherein said soft magnetic material is selected from the group of soft magnetic materials consisting of Ni, Fe, Co, and B.

51. The magnetic tunnel junction element of claim 48 wherein said spacer layer comprises a non-magnetic material.

52. The magnetic tunnel junction element of claim 51 wherein said non-magnetic material is selected from the group of non-magnetic materials consisting of Ru, Rh, and Cr.

53. The magnetic tunnel junction element of claim 48 wherein said reference layer comprises a material with a large magnetostriction constant.

54. The magnetic tunnel junction element of claim 53 wherein said material with a large magnetostriction constant is selected from a group of materials consisting of CoFeB, CoFe and multiple layered structures of CoFeB and CoFe.

55. The magnetic tunnel junction element of claim 29 wherein said plurality of magnetic tunnel junction elements are annealed for said first time is at a temperature of from approximately 200° C. to approximately 300° C. for a period of between 5 minutes and 100 minutes in the presence of a very large magnetic field of greater than approximately 1000 Gauss oriented in the direction of the reference axis (X).

56. The magnetic tunnel junction element of claim 55 wherein said magnetic tunnel junction elements are annealed a second time at a temperature of from approximately 200° C. to approximately 250° C. for a period of between 5 minutes and 100 minutes in the presence of no magnetic field.

57. A method for forming a magnetic field angle sensor for measurement of a magnetic field angle over a 360° range of measurement, said method comprising the steps of:
forming a plurality of magnetic tunnel junction elements on a substrate by the steps of:
depositing an anti-ferromagnetic material on a bottom electrode formed on said substrate;
forming a pinned synthetic multiple layer formed on said antiferromagnetic material;
annealing for a first time said anti-ferromagnetic in the presence of a strong magnetic field in a direction of the reference axis; and
patterning said plurality of magnetic tunnel junction elements such that each magnetic tunnel junction element has a large dimensional aspect ratio and has large anisotropies in each of said pinned synthetic multiple layer of said plurality of magnetic tunnel junction elements; and
annealing said plurality of magnetic tunnel junction elements for a second time with no external magnetic field so that exchange pinning is reduced during said annealing and strong stress induced anisotropies of said pinned synthetic multiple layer align magnetization of said pinned synthetic multiple layer align a long axis of each of said plurality of magnetic tunnel junction elements.

58. The method of forming said magnetic field angle sensor of claim 57 further comprising the steps of:
forming a first type of said plurality of magnetic tunnel junction elements by orienting a first grouping of said plurality of said magnetic tunnel junction elements to have their long axis placed at a first angle from said direction of the reference axis;
forming a second type of said plurality of magnetic tunnel junction elements by orienting a second grouping of said plurality of said magnetic tunnel junction elements to have their long axis placed at a 0° from said direction of the reference axis, and
forming a third type of said plurality of magnetic tunnel junction elements by orienting a third grouping of said plurality of said magnetic tunnel junction elements to have their long axis placed at a second angle from said direction of the reference axis.

59. The method of forming said magnetic field angle sensor of claim 58 wherein said reference angle has an absolute value equal to said second angel and has an opposite sign to said second angle.

60. The method of forming said magnetic field angle sensor of claim 59 wherein said absolute values for said first and second angles are from approximately 15° to approximately 65°.

61. The method of forming said magnetic field angle sensor of claim 58 further comprising the steps of:
connecting a grouping of said plurality of said magnetic tunnel junction elements in parallel between a top electrode and said bottom electrode; and
patterning said top electrode and said bottom electrode to have a large dimensional aspect ratio such that said top electrode and said bottom electrode have length dimensions oriented perpendicular to a long dimension of each of said grouping of said plurality of said magnetic tunnel junction elements.

62. The method of forming said magnetic field angle sensor of claim 58 further comprising the step of connecting said plurality of magnetic tunnel junction elements to form a first Wheatstone bridge and a second Wheatstone bridge such that in a presence of no external magnetic field a first differential measurement voltage level developed between a first pair of opposing terminals of said first Wheatstone bridge and a second differential measurement voltage level developed between a first pair of opposing terminals of said second Wheatstone bridge are zero volts.

63. The method of forming said magnetic field angle sensor of claim 62 wherein a first branch of said first Wheatstone bridge comprises at least one of said first type of magnetic tunnel junction elements.

64. The method of forming said magnetic field angle sensor of claim 63 wherein a second branch of said first Wheatstone bridge connected to said first branch comprises at least one of said third type of magnetic tunnel junction elements.

65. The method of forming said magnetic field angle sensor of claim 64 wherein a third branch of said first Wheatstone bridge comprises at least one of said third type of magnetic tunnel junction elements.

66. The method of forming said magnetic field angle sensor of claim 65 wherein a fourth branch of said first Wheatstone bridge connected to said third branch comprises at least one of said first type of magnetic tunnel junction elements.

67. The method of forming said magnetic field angle sensor of claim 65 wherein a first branch of said second Wheatstone bridge comprises at least one of said first type of magnetic tunnel junction elements serially connected with at least one of said third type of magnetic tunnel junction elements.

68. The method of forming said magnetic field angle sensor of claim 67 wherein a second branch of said second Wheatstone bridge connected to said first branch comprises at least one of said second type of magnetic tunnel junction elements.

69. The method of forming said magnetic field angle sensor of claim 68 wherein a third branch of said second Wheatstone bridge comprises at least one of said second type of magnetic tunnel junction elements.

70. The method of forming said magnetic field angle sensor of claim 69 wherein a fourth branch of said second Wheatstone bridge connected to said third branch comprises at least one of said first type of magnetic tunnel junction elements serially connected with at least one of said third type of magnetic tunnel junction elements.

71. The method of forming said magnetic field angle sensor of claim 62 further comprising the step of connecting a power supply voltage source between a second pair of opposing terminals of each Wheatstone bridge to provide a biasing voltage for said two Wheatstone bridges.

72. The method of forming said magnetic field angle sensor of claim 62 further comprising the steps of:
equalizing said first differential measurement voltage level and said second differential measurement voltage level to have approximately equivalent amplitude; and
determining said magnetic field angle by the equation:

$$\theta = \arctan\left(\frac{\Delta U_1}{\Delta U_2}\right)$$

where:

$\Delta U_1 = A \sin(\theta)$, $\Delta U_2 = A \cos(\theta)$,

θ is the magnetic field angle, and
A is said equalized equivalent amplitude of the first and second differential measurement voltage levels.

73. The method of forming said magnetic field angle sensor of claim 57 wherein said long axis of each of said plurality of magnetic tunnel junction elements are perpendicular to a top electrode and a bottom electrode connected to each of the plurality of magnetic tunnel junction elements.

74. The method of forming said magnetic field angle sensor of claim 57 wherein said long axis of each of said plurality of magnetic tunnel junction elements are parallel to said top electrode and said bottom electrode connected to each of the plurality of magnetic tunnel junction elements.

75. The method of forming said magnetic field angle sensor of claim 57 wherein said anti-ferromagnetic material is selected from the group of anti-ferromagnetic materials consisting of IrMn, PtMn, FeMn, NiO, and any material having magnetically oriented anti-parallel sub-lattices.

76. The method of forming said magnetic field angle sensor of claim 57 wherein forming said pinned synthetic multiple layer comprises the steps of:
depositing a pinned magnetic layer directly on said anti-ferromagnetic material,
depositing a spacer layer on said pinned magnetic layer, and
depositing a reference layer on said spacer layer.

77. The method of forming said magnetic field angle sensor of claim 76 wherein said pinned magnetic layer is a soft magnetic material with a first magnetostriction constant selected from a group of magnetostriction constants consisting of a magnetostriction constant approaching a zero level and a magnetostriction constant having a positive magnitude.

78. The method of forming said magnetic field angle sensor of claim 77 wherein said soft magnetic material is selected from the group of soft magnetic materials consisting of Ni, Fe, Co, and B.

79. The method of forming said magnetic field angle sensor of claim 76 wherein said spacer layer comprises a non-magnetic material.

80. The method of forming said magnetic field angle sensor of claim 79 wherein said non-magnetic material is selected from the group of non-magnetic materials consisting of Ru, Rh, and Cr.

81. The method of forming said magnetic field angle sensor of claim 76 wherein said reference layer comprises a material with a large magnetostriction constant.

82. The method of forming said magnetic field angle sensor of claim 81 wherein said material with a large magnetostriction constant is selected from a group of materials consisting of CoFeB, CoFe and multiple layered structures of CoFeB and CoFe.

83. The method of forming said magnetic field angle sensor of claim 57 wherein annealing said plurality of magnetic tunnel junction elements for said first time comprises the steps of:
setting said plurality of magnetic tunnel junction elements at a temperature of from approximately 200° C. to approximately 300° C. for a period of between 5 minutes and 100 minutes; and
placing said plurality of magnetic tunnel junction elements in the presence of a very large magnetic field of greater than approximately 100 Gauss oriented in the direction of the reference axis (X).

84. The method of forming said magnetic field angle sensor of claim 57 wherein annealing said plurality of said magnetic tunnel junction elements a second time comprises the steps of:
setting said plurality of said magnetic tunnel junction elements at a temperature of from approximately 200° C. to approximately 250° C. for a period of between 5 minutes and 1000 minutes in the presence of no magnetic field.

* * * * *